United States Patent
Huang

(10) Patent No.: US 6,630,729 B2
(45) Date of Patent: Oct. 7, 2003

(54) LOW-PROFILE SEMICONDUCTOR PACKAGE WITH STRENGTHENING STRUCTURE

(75) Inventor: Chien Ping Huang, Hsin-chu (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/908,236

(22) Filed: Jul. 18, 2001

(65) Prior Publication Data

US 2002/0027273 A1 Mar. 7, 2002

(30) Foreign Application Priority Data

Sep. 4, 2000 (TW) .......................... 89118027 A

(51) Int. Cl.[7] .......................................... H01L 23/495
(52) U.S. Cl. .................... 257/676; 257/666; 257/787; 257/784
(58) Field of Search ................. 257/676, 666, 257/787, 784, 670, 686, 779

(56) References Cited

U.S. PATENT DOCUMENTS

| | | | |
|---|---|---|---|
| 5,172,214 A | 12/1992 | Casto | 257/676 |
| 5,942,794 A | 8/1999 | Okumura et al. | 257/666 |
| 6,075,284 A * | 6/2000 | Choi et al. | 257/676 |
| 6,201,292 B1 * | 3/2001 | Yagi et al. | 257/666 |
| 6,281,568 B1 * | 8/2001 | Glenn et al. | 257/684 |
| 6,297,543 B1 * | 10/2001 | Hong et al. | 257/666 |
| 6,303,997 B1 * | 10/2001 | Lee | 257/778 |

* cited by examiner

Primary Examiner—David L. Talbott
Assistant Examiner—Luan Thai
(74) Attorney, Agent, or Firm—Peter F. Corless; Steven M. Jensen; Edwards & Angell, LLP

(57) ABSTRACT

A semiconductor package and a fabricating method thereof are proposed. The semiconductor package includes a semiconductor chip; a plurality of leads surrounding the chip and formed with a plurality of connecting mechanisms and strengthening structures; and an encapsulant for encapsulating the chip and the leads. The foregoing semiconductor package eliminates the use of a die pad, allowing the thickness of the package to be reduced and a surface of the chip to be exposed to the outside of the encapsulant for improving the heat dissipating efficiency thereof. The leads have the same height as the semiconductor package, allowing upper and lower surfaces of the leads to be exposed to the outside of the encapsulant, which further enhance the dissipation of heat generated by the chip in operation. The strengthening structures of the leads significantly enhance the bonding strength between the leads and the encapsulant for preventing delamination or crack from occurrence, so that quality and liability of the semiconductor package can be assured.

8 Claims, 6 Drawing Sheets

LOW-PROFILE SEMICONDUCTOR PACKAGE WITH STRENGTHENING STRUCTURE

FIELD OF THE INVENTION

The present invention relates to semiconductor packages and fabricating methods thereof, and more particularly, to a semiconductor package which is compact in size and assured in quality, and a fabricating method thereof

BACKGROUND OF THE INVENTION

A conventional QFN (Quad Flat Non-leaded) semiconductor package 10, disclosed in U.S. Pat. No. 5,172,214 as illustrated in FIG. 1, includes a semiconductor chip 11; a die pad 12 having a first surface 12a and a second surface 12b for attaching the chip 11 on the first surface 12a; a plurality of leads 13 disposed around the die pad 12 and electrically connected to the chip 11; and an encapsulant 19 for encapsulating the chip 11, the die pad 12, and the leads 13. The leads 13 each has a first portion 14 located closely to the chip 1, a second portion 16 partially exposed to the outside of the encapsulant 19, and an intermediate portion 15 for connecting the first portion 14 and the second portion 16. The second portions 16 of the leads 13 serve as I/O terminals for electronic transmission so as to electrically connecting the semiconductor package 10 by means of solder balls (not shown) to a substrate such as an external printed circuit board (not shown). Furthermore, the electrical connection between chip 11 and the leads 13 can be achieved either through gold wires 17 as illustrated in left part of FIG. 1, or through solder balls 18 by means of a TAB (Tape Automated Bonding) technique as illustrated in right part of FIG. 1. In addition, the die pad 12 has the second surface 12b thereof exposed to the outside of the encapsulant 19, allowing heat generated by the chip 11 in operation to be dissipated to the outside of the semiconductor package 10 through the exposed surface 12b of the die pad 12.

FIG. 2 illustrates another conventional QFN semiconductor package disclosed in U.S. Pat. No. 5,942,794. As shown in the drawing, this QFN semiconductor package 20 includes a semiconductor chip 21; a die pad 22 for mounting the chip 21 thereon; a plurality of leads 23 electrically connected to the chip 21 through gold wires 27; and an encapsulant 29 for encapsulating the chip 21, the die pad 22, the gold wires 27 and the leads 23. The leads 23 each has a surface 23a partially exposed to the outside of the encapsulant 29 for serving as I/O terminals for electronic transmission so as to electrically connect the semiconductor package 20 to a substrate such as an external printed circuit board (not shown). The QFN semiconductor package 20 differs from the QFN semiconductor package 10 in FIG. 1 in that the die pad 22 of the semiconductor package 20 with tie bars 25 thereof being bent upwardly is more elevated in position than the leads 23, allowing the die pad 22 to be entirely encapsulated in the encapsulant 29. Moreover, unlike the leads of the semiconductor package 10 in FIG. 1, the leads 23 in FIG. 2 are not formed with a height difference therewithin.

Unlike conventional semiconductor packages such as QFP (Quad Flat Package) and SOP (Small Outline Package), the foregoing two QFN semiconductor packages are not provided with downwardly bent outer leads, which makes the QFN packages reduced in thickness to 0.85 mm, which is about half thick as a conventional package.

However, for fabricating the foregoing OFN packages, due to lack of adequate support or clamping force during molding the encapsulant, the die pad or the leads tend to be dislocated when a molding resin is injected rapidly, allowing a small amount of the molding resin to be squeezed into spacing between the die pad or the leads and a mold. As a result, flash occurs on the exposed surface 12b of the die pad or the exposed portion of the second portions 16 of the leads of the semiconductor package 10 in FIG. 1, or flash occurs on the exposed surfaces 23a of the leads of the semiconductor package 20 in FIG. 2, so that quality of the fabricated semiconductor package is severely degraded.

The foregoing flash problem can be solved by adhering a tape to a bottom surface of the die pad and leads for preventing flash from occurrence. However, during a wire-bonding process, a cushion effect provided by the tape may cause the leads to shift in position, which definitely degrade the wire-bonding quality.

Furthermore, the 0.85 mm OFN package may be out of date according to increased demand for even thinner electronic devices, and thus it is needed to further reduce the thickness of the QFN package.

In addition, the foregoing QFN packages have the leads thereof partially exposed to the outside of the encapsulant rather than entirely encapsulated in the encapsulant, which make contact area between the leads and the encapsulant reduced, allowing bonding strength to be deteriorated as well as delamination to be generated between the leads and the encapsulant, so that quality and liability of the QFN package are detrimentally affected.

SUMMARY OF THE INVENTION

A primary objective of the present invention is to provide a semiconductor package and a fabricating method thereof, which can effectively reduce the thickness of the semiconductor package and prevent delamination from occurrence.

In accordance with the foregoing and other objectives, the semiconductor package proposed in the invention comprises: a semiconductor chip having a first surface and a second surface; a plurality of leads disposed around the chip and having the same height as the semiconductor package, with strengthening structures being formed on sides of the leads; a plurality of connecting mechanisms formed at the leads and extending from surfaces of the leads toward the chip, for being electrically connected to the first surface of the chip and the leads; and an encapsulant for encapsulating the chip, the connecting mechanisms and the leads, with at least the second surface of the chip and upper and lower surfaces of the leads being exposed to the outside of the encapsulant.

The fabricating method of the foregoing semiconductor package of the invention comprises the following steps: providing a lead frame having a plurality of leads extending from a frame of the lead frame, wherein the leads are formed with strengthening structures on sides thereof, and a plurality of connecting mechanisms extend from surfaces of inner sides of the leads; attaching a supporting carrier to a bottom surface of the lead frame; mounting a semiconductor chip having a first surface and a second surface in a space on a surface of the carrier, wherein the space is predefined by the frame of the lead frame and the leads; electrically connecting the first surface of the chip to the corresponding connecting mechanisms of the leads; performing a molding process to form an encapsulant in the space acting as a mold cavity defined by the frame of the lead frame and the leads; removing the carrier; and performing a singulating process to form individual semiconductor packages.

As concluded from the above mentioned, as compared with a conventional semiconductor package, the semiconductor package of the invention eliminates the use of a die pad, allowing the second surface of the chip to be exposed to the outside of the encapsulant, which simplifies the construction of the lead fame and makes the package further reduced to below 0.40 mm in thickness as well as improves the heat dissipating efficiency thereof.

Moreover, during the molding process, with the use of the space acting as the mold cavity predefined by the frame of the lead frame and the leads, the invention can adopt upper and lower molds with no mold cavity for forming the encapsulant, which allows the molding process to be performed for packages in various sizes, and saves the manufacturing cost for the molds. Furthermore, as the chip and the lead frame have bottom surfaces thereof attached to the supporting carrier, and the leads of the lead frame have the upper surfaces thereof tightly clamped by the upper mold, therefore a mold resin can be prevented from flashing on the exposed surfaces of the chip and the leads.

Besides, on the sides of the leads there are formed the strengthening structures, which help significantly increase bonding strength between the leads and the encapsulant for preventing delamination or crack from occurrence, so that quality and liability of the semiconductor package can be assured.

In addition, the leads have both the upper and lower surfaces thereof exposed to the outside of the encapsulant, allowing the semiconductor packages to be stacked together in a manner that the package has its upper surface abutting a corresponding lower surface of an adjacent package, so as to increase the layout density and strengthen the performance for the packages.

BRIEF DESCRIPTION OF DRAWINGS

The invention can be more filly understood by reading the following detailed description of the preferred embodiments, with reference made to the accompanying drawings, wherein.

DETAILED DESCRIPTION OF PREFERRED EMBODIMENTS

First Preferred Embodiment

Figure 3:
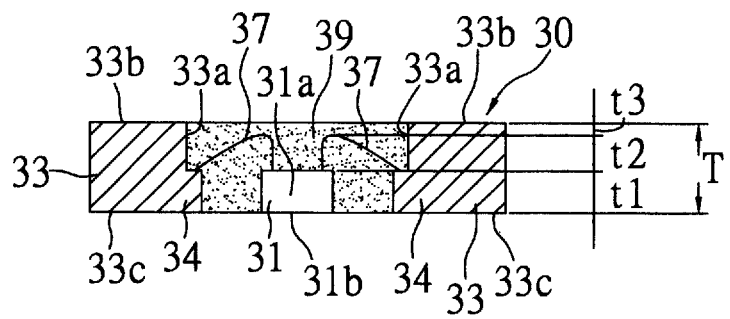
FIG. 3 is a schematic sectional diagram of a first preferred embodiment of the semiconductor package according to the invention.

Referring to FIG. 3, the semiconductor package 30 of the first preferred embodiment according to the invention includes a semiconductor chip 31 having a first surface 31a and a second surface 31b; a plurality of leads 33 disposed around the chip 31 and having the same height as the semiconductor package 30; a plurality of connecting mechanisms 34 formed on the leads 33 and extending from a surface 33a of the leads toward the chip 31; and an encapsulant 39 for encapsulating the chip 31, the connecting mechanisms 34 and the leads 33, with at least the second surface 31b of the chip 31 and an upper surface 33b and a lower surface 33c of the leads 33 being exposed to the outside of the encapsulant 39. Furthermore, the chip 31 is electrically connected to the leads 33 by means of a plurality of metal wires 37 such as gold wires having two ends thereof respectively welded at the first surface 31a of the chip 31 and the connecting mechanisms 34 of the leads 33. In addition, the leads 33 formed with the connecting mechanisms 34 have an integral cross section of a L-like shape, as illustrated in a portion shadowed with oblique lines in FIG. 3.

Figure 1:
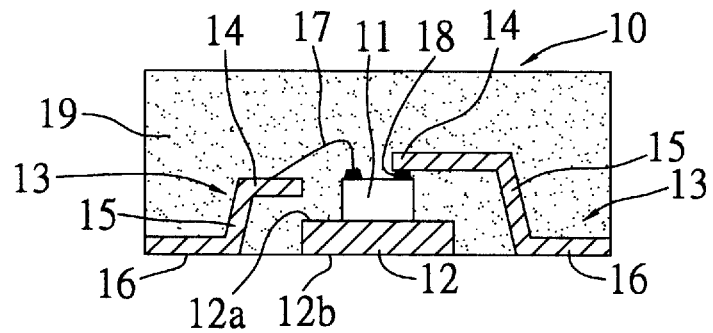
FIG. 1 (PRIOR ART) is a schematic sectional diagram of a first conventional QFN semiconductor package.
Figure 2:
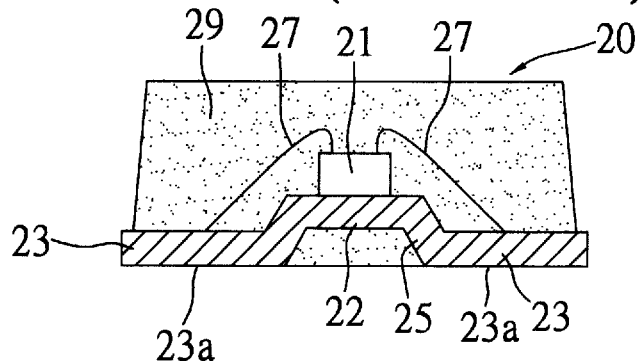
FIG. 2 (PRIOR ART) is a schematic sectional diagram of a second conventional QFN semiconductor package.

Unlike a conventional package illustrated in FIG. 1 and FIG. 2, the semiconductor package of the invention eliminates the use of a die pad, and according allows the overall thickness of the package to be reduced. Moreover, the semiconductor package 30 in FIG. 3 can optionally have the chip thickness $t_1$, the loop height of the metal wires 37 $t_2$, and the distance $t_3$ from the loop to of the metal wires 37 to a top surface of the semiconductor package 30 (i.e. a top surface of the encapsulant 39) respectively set as 0.15 mm (or less), 0.15 mm (or less), and 0.10 mm (or less). In this case, the overall thickness $T(t_1+t_2+t_3)$ of the semiconductor package 30 can be 0.40 mm or less, which is significantly thinner than a conventional QFN semiconductor package having a thickness of 0.85 mm.

In addition, as the invention can be implemented without the use of a die pad, it helps simplify the construction and save the manufacturing cost for the lead frame, as well as increase the dissipation of heat generated by the chip 31 through the exposed surface 31b of the chip 31 to the outside of the semiconductor package 30.

Second Preferred Embodiment

Figure 4:
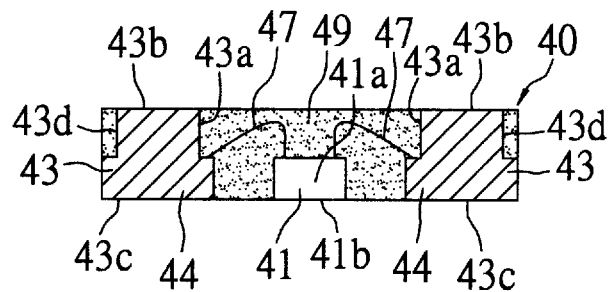
FIG. 4 is a schematic sectional diagram of a second preferred embodiment of the semiconductor package according to the invention.

Referring to FIG. 4, the semiconductor package 40 the second preferred embodiment of the invention differs from the semiconductor package 30 of the first preferred embodiment in FIG. 3 only in shapes of leads 43 of the semiconductor package 40. From outer sides of the leads 43 there are withdrawn portions 43d, which make the leads 43 with the portions 43d being withdrawn in an inverted T shape, so as to increase the bonding strength between the leads 43 and an encapsulant 49 for preventing delamination or crack from occurrence.

Third Preferred Embodiment

Figure 5:
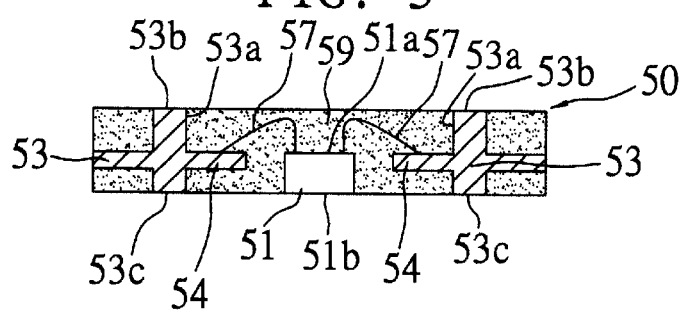
FIG. 5 is a schematic sectional diagram of a third preferred embodiment of the semiconductor package according to the invention.

The third preferred embodiment 50 of the invention, as illustrated in FIG. 5, differs from the first and second embodiments only in shapes of leads 53 and connecting mechanisms 54. In this embodiment, the leads 53 formed with the connecting mechanisms 54 have an integral cross section of a cross-like shape, which helps further enhance the bonding strength between the leads 53 and an encapsulant 59.

Fourth Preferred Embodiment

Figure 6:
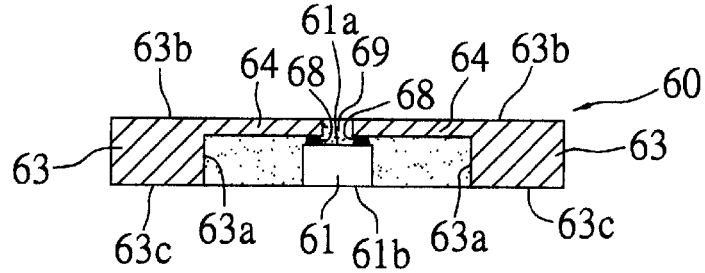
FIG. 6 is a schematic sectional diagram of a fourth preferred embodiment of the semiconductor package according to the invention.

The fourth preferred embodiment 60 in FIG. 6 differs from the previous three embodiments particularly in using a different TAB technique for electrically connecting a semiconductor chip 61 to leads 63, wherein connecting mechanisms 64 extend from a surface 63a of the leads 63 toward the chip 61 to a position above a first surface 61a of the chip 61, which make the integral cross section of the leads 63 and the connecting mechanisms 64 is in a L-like shape. The connecting mechanisms 64 are then electrically connected to the chip 61 through solder balls 68 by the TAB technique. This allows the overall package size to be made even smaller in thickness than the previous embodiments.

Fifth Preferred Embodiment

Figure 7:
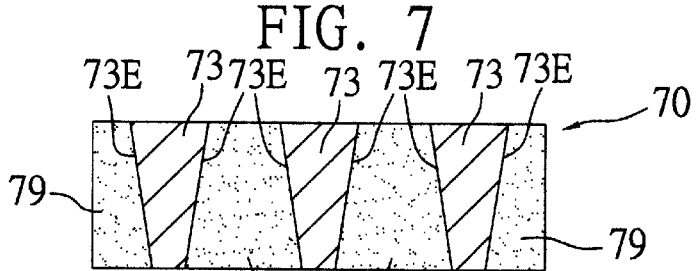
FIG. 7 is a schematic side view of a fifth preferred embodiment of the semiconductor package according to the invention.

FIG. 7 illustrates the fifth preferred embodiment 70 of the invention, wherein on sides of leads 73 there are formed strengthening structures 73E having gradients, allowing the leads 73 with the gradients to have an increased contact area with an encapsulant 79 as compared to conventional leads without gradients, so as to prevent delamination or crack from occurrence.

Sixth Preferred Embodiment

Figure 8:
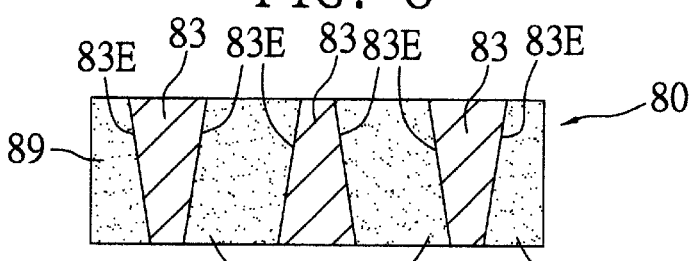
FIG. 8 is a schematic side view of a sixth preferred embodiment of the semiconductor package according to the invention.

The sixth preferred embodiment 80 in FIG. 8 is characterized with strengthening structures 83E formed by inverting the arrangement of the strengthening structures 73E of the leads 73 in the fifth embodiment 70, and similarly, the contact area between the leads 83 and an encapsulant 89 is accordingly increased by means of the strengthening structures 83E for enhancing the bonding strength therebetween.

Seventh Preferred Embodiment

Figure 9:
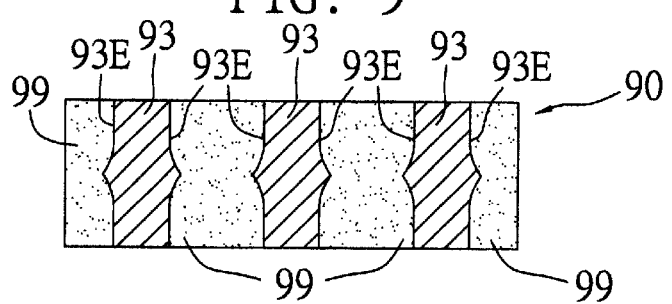
FIG. 9 is a schematic side view of a seventh preferred embodiment of the semiconductor package according to the invention.

The seventh preferred embodiment in FIG. 9 have sides of leads 93 formed with protrusions 93E as strengthening structures, allowing the leads 93 to be strongly engaged with an encapsulant 99 for strengthening the bonding between the leads 93 and the encapsulant 99.

The strengthening structures 73E, 83E or 93E in the fifth, sixth or seventh embodiments can be formed on the sides of the leads 73, 83 or 93 respectively by using an etching or conventional mechanical process. Further, the strengthening structures can also be formed as embossed patterns (not shown), a plurality of recess holes (not shown), or a plurality of protruding points (not shown), for helping increase the contact area and bonding strength between the leads and the encapsulant.

FIGS. 10A–10G illustrate the steps of the fabricating method for the semiconductor package according to the invention, and FIGS. 11A–11G are sectional views of FIGS. 10A–10G respectively. The fabricating method of the invention is described with reference to the semiconductor package 30 of the first embodiment in FIG. 3.

Figure 10A:
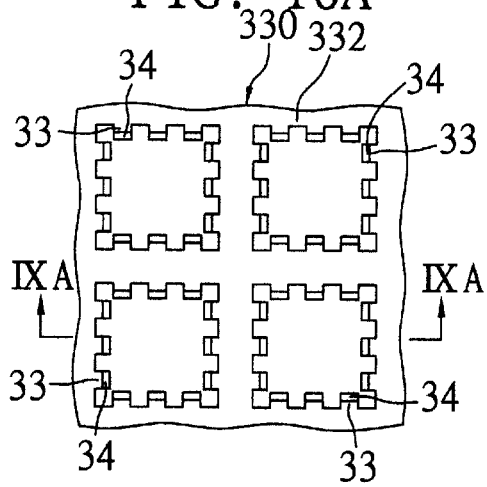
FIGS. 10A–10G are schematic top views showing the steps of the fabricating method of the first preferred embodiment according to the invention.
Figure 11A:
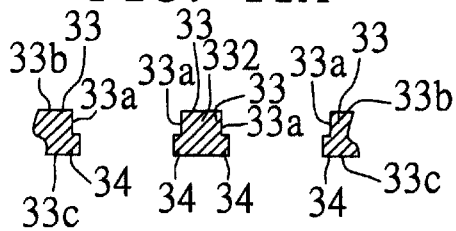
FIGS. 11A–11G are sectional views of FIGS. 10A–10G respectively.

Referring to FIGS. 10A and 11A, first, an integrally-formed array lead frame 330 is prepared with at least four package units arranged in array predefined thereon, wherein each package unit includes a plurality of leads 33 formed on and extending from a frame 332. This allows the package fabrication to be able to encapsulate at least four semiconductor chips in each molding for increasing the productivity. On surfaces of inner ends 33a of the leads 33 there are formed connecting mechanisms 34 by using a conventional process such as etching. Further, on sides of the leads 33 there can be formed with strengthening structures as those illustrated in FIGS. 7, 8 and 9.

Figure 10B:
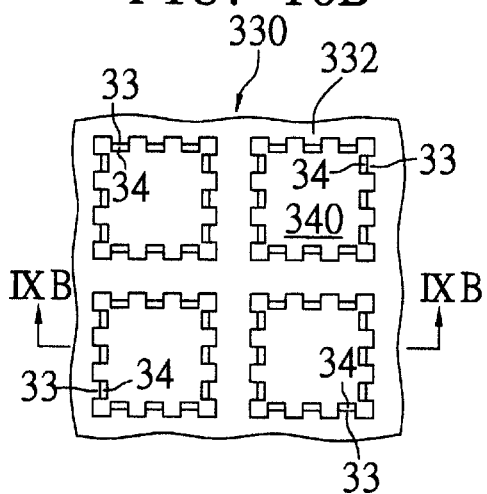
Figure 11B:
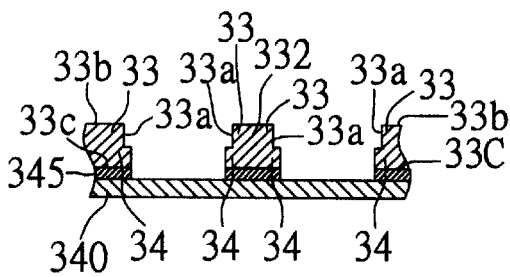

Referring further to FIGS. 10B and 11B, to a bottom surface of the lead frame 330 there is temporarily attached a supporting carrier 340 by means of an adhesive 345 such as epoxy or silicon. The supporting carrier 340 is made of metal or polyimide.

Figure 10C:
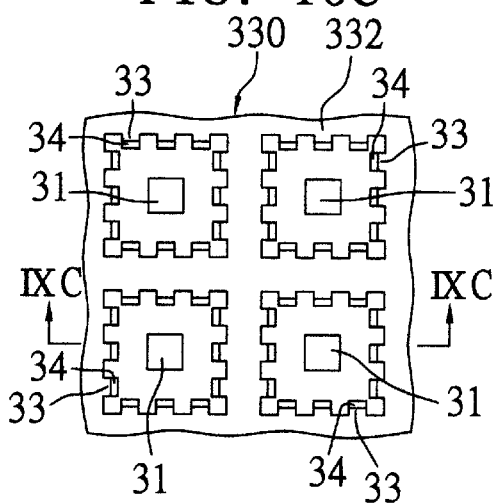
Figure 11C:
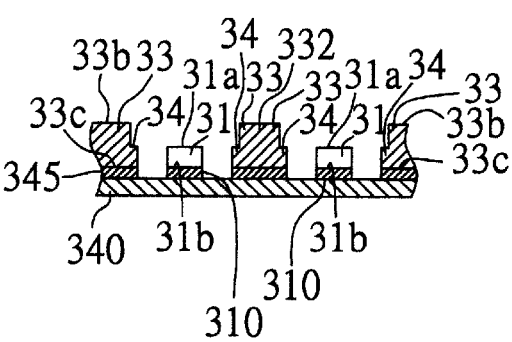
Figure 10D:
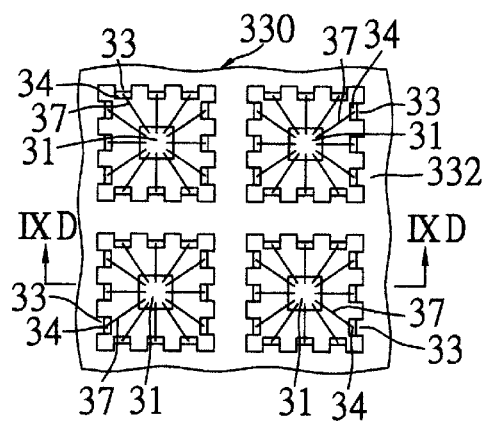
Figure 11D:
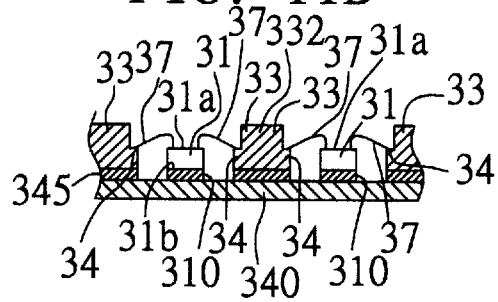

Referring further to FIGS. 10C and 11C, the second surface 31b of the semiconductor chip 31 is temporarily attached to a space on the supporting carrier 340 by means of an adhesive 310, wherein the space is predefined by the frame 332 and the leads 33. The chip 31 is then electrically connected to the leads 33 in a manner that the metal wires 37 interconnect the first surface 31a of the chip 31 and the connecting mechanisms 34 of the leads 33, as illustrated in FIGS. 10D and 11D. Alternatively, solder balls such as tin balls or gold balls can be used in place of the metal wires by using the TAB process as recited in the fourth embodiment in FIG. 6.

Figure 10E:
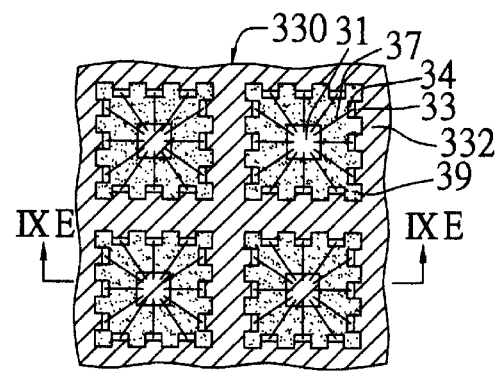
Figure 11E:
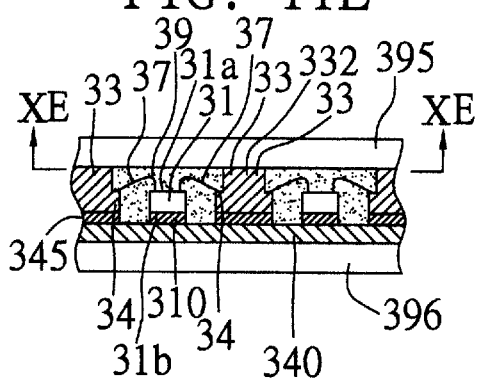

Referring further to FIGS. 10E and 11E, a molding process is performed. With the use of the space predefined by the frame 332 and the leads 33 as a molding cavity, upper and lower molds 395, 396 with no cavity are applied, rather than molds with a cavity in various sizes as required for various semiconductor packages, so that the manufacturing cost for the molds is reduced and the compatibility of the molds is raised. Moreover, during molding, as the second surface 31b of the chip 31 and the bottom surface of the leads 330 are attached to the supporting carrier 340 as well as a top surface of the leads 33 is clamped by the upper mold 395, a molding resin can be prevented from flashing on the second surface 31b of the chip 31 and both the top and bottom surfaces of the leads 33, allowing the semiconductor package to be more assured in quality.

Figure 10F:
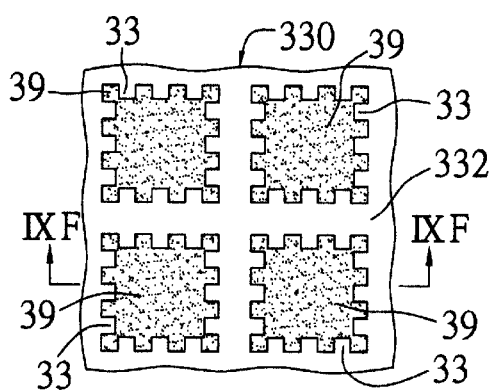
Figure 11F:
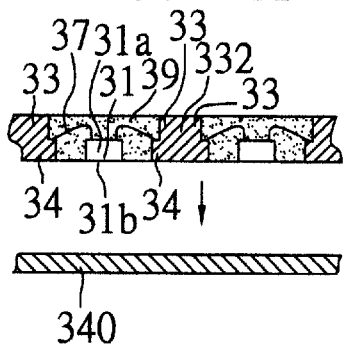

Referring further to FIGS. 10F and 11F, after the molding process is completed, the supporting carrier 340 is detached from the lead frame 330.

Figure 10G:
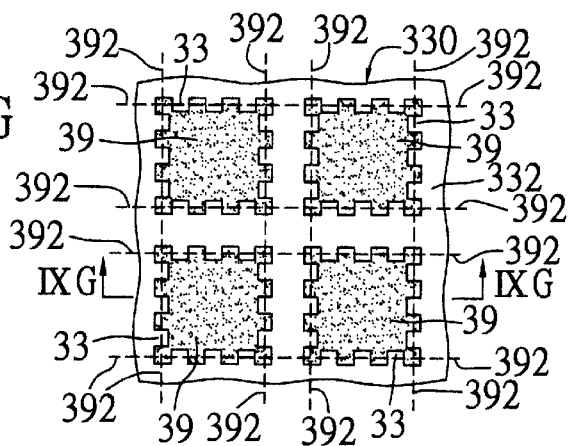
Figure 11G:
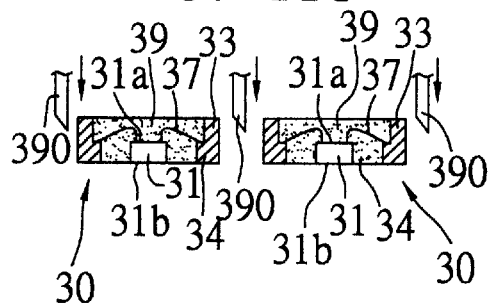

Referring further to FIGS. 10G and 11G, finally, a singulating process is performed by using a sawing blade 390 to cut the lead frame 330 along cutting lines 392 so as to form individual semiconductor packages 30. This completes the fabrication for the semiconductor package of the invention.

Figure 12:
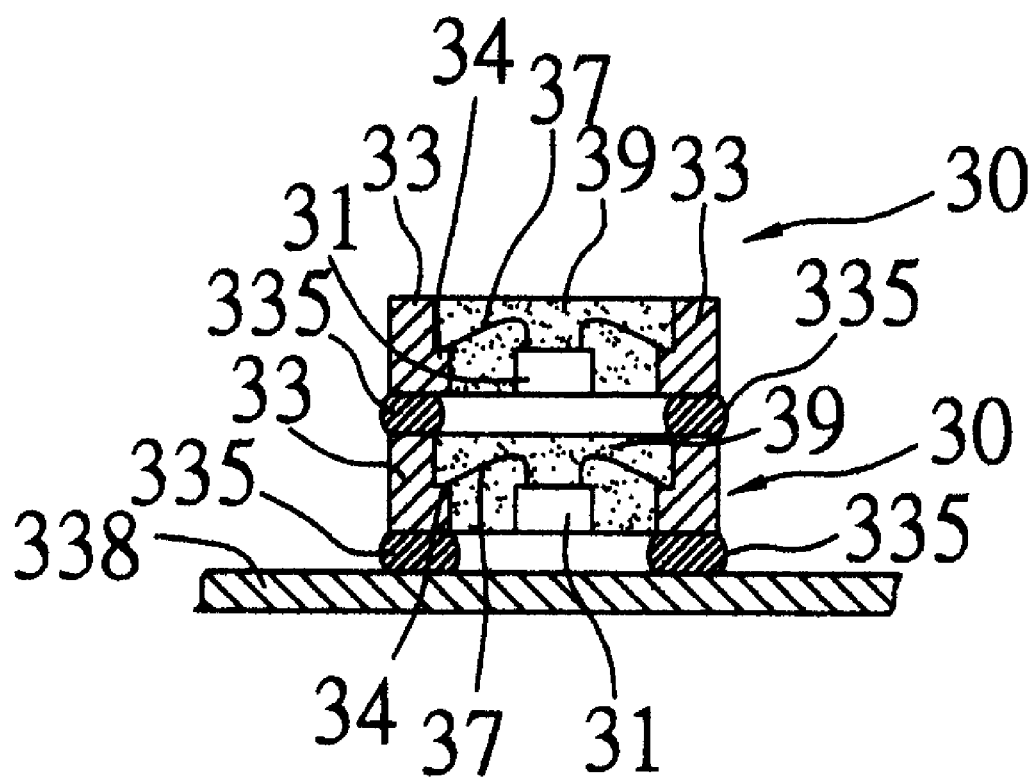
FIG. 12 is a schematic diagram showing the stacking of the semiconductor packages of the invention on a substrate such as a printed circuit board.

The semiconductor package of the invention fabricated according to the foregoing method has the leads thereof with both the top and bottom surfaces exposed to the outside of the encapsulant, allowing the packages to be stacked together in a manner that the exposed surfaces act as input/output terminals for electronic transmission for increasing the layout density and performance of the packages. Referring to FIG. 12, in exemplification of the first embodiment in FIG. 3, the stacked semiconductor packages 30 have the exposed surfaces of the leads 33 welded to each other by using a conductive material process 335 such as solder tin, which is further applied for welding the bottom surface of the leads 33 of the lower package to a substrate 338 such as a printed circuit board for offering a doubled level of functionality.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:

a semiconductor chip having a first surface and a second surface opposed to first surface;

a lead frame having a plurality of leads disposed around the chip, the chip being free of contact with the lead frame, the leads having the same height as the semiconductor package, wherein each of the leads has an upper surface, a lower surface opposed to the upper surface, and at least a side that faces toward an adjacent lead and is fanned with at least a strengthening structure thereon, so as to increase contact area and bonding strength between the leads and a resin compound used for encapsulating the leads, and wherein the second surface of the chip is flush with the lower surfaces of the leads to form a coplanar surface;

a plurality of connecting mechanisms fanned on the leads and extending from surfaces of the leads toward the chip, wherein the connecting mechanisms are spaced apart from the chip and electrically connected to the first surface of the chip; and an encapsulant formed of the resin compound for encapsulating the chip, the leads and the connecting mechanisms, with at least the second surface of the chip and the upper and lower surfaces of the leads being exposed to outside of the encapsulant.

2. The semiconductor package of claim 1, wherein the connecting mechanisms are electrically connected to the chip by means of metal wires.

3. The semiconductor package of claim 1, wherein the leads formed with the connecting mechanisms have an integral cross section selected from the group consisting of a L-like shape, an inverted T shape, a cross-like shape or an inverted-L shape.

4. The semiconductor package of claim 1, wherein the strengthening structures are sides having gradients.

5. The semiconductor package of claim 1, wherein the strengthening structures are protrusions formed on the sides of the leads.

6. The semiconductor package of claim 1, wherein the strengthening structures are embossed patterns formed on the sides of the leads.

7. The semiconductor package of claim 1, wherein the strengthening structures are a plurality of recess holes formed on the sides of the leads.

8. The semiconductor package of claim 1, wherein the strengthening structures are a plurality of protruding points formed on the sides of the leads.

* * * * *